US012591016B2

(12) United States Patent
Cao et al.

(10) Patent No.: US 12,591,016 B2
(45) Date of Patent: Mar. 31, 2026

(54) OCV DETECTION METHOD AND DETECTION DEVICE

(71) Applicant: Contemporary Amperex Technology (Hong Kong) Limited, Hong Kong (CN)

(72) Inventors: Wei Cao, Ningde (CN); Wenchao Wei, Ningde (CN); Wentao Chen, Ningde (CN)

(73) Assignee: CONTEMPORARY AMPEREX TECHNOLOGY (HONG KONG) LIMITED, Hong Kong (CN)

( * ) Notice: Subject to any disclaimer, the term of this patent is extended or adjusted under 35 U.S.C. 154(b) by 75 days.

(21) Appl. No.: 18/427,403

(22) Filed: Jan. 30, 2024

(65) Prior Publication Data

US 2024/0426926 A1 Dec. 26, 2024

Related U.S. Application Data

(63) Continuation of application No. PCT/CN2023/101923, filed on Jun. 21, 2023.

(51) Int. Cl.
*G01R 31/385* (2019.01)
*G01R 31/36* (2020.01)

(52) U.S. Cl.
CPC ..... *G01R 31/3865* (2019.01); *G01R 31/3644* (2013.01)

(58) Field of Classification Search
CPC ........................ G01R 31/3865; G01R 31/3644
(Continued)

(56) References Cited

U.S. PATENT DOCUMENTS 10,622,603 B2 * 4/2020 Nakai ................. H01M 50/262
2011/0234232 A1 9/2011 Ro
(Continued)

FOREIGN PATENT DOCUMENTS

CN 107282475 A 10/2017
CN 110052418 A 7/2019
(Continued)

OTHER PUBLICATIONS

The European Patent Office (EPO) The Extended European Search Report for Application No. 23832983.7, May 9, 2025, 9 Pages.
(Continued)

*Primary Examiner* — Huy Q Phan
*Assistant Examiner* — Trung Q Nguyen
(74) *Attorney, Agent, or Firm* — ANOVA LAW GROUP, PLLC

(57) ABSTRACT

An OCV detection method comprises: performing OCV detection on to-be-detected materials, wherein to-be-detected battery materials are transported to an OCV detection location for detection, and when the detection result is unqualified, all the materials are transported to a replacement location; performing OCV detection on transferred materials, wherein the OCV detection is performed on transferred battery materials at a transfer station, and the quantity of the detected transferred battery materials is one or more; and performing primary battery replacement. Ater the OCV detection, defective products in the to-be-detected battery materials are transferred to the transfer station, and good products in the transferred battery materials are transferred to the replacement location. Accordingly, in addition to performing OCV detection on regular to-be-detected battery materials, the OCV detection can be performed on transferred battery materials, so that it is possible to detect
(Continued)

Perform OCV detection on to-be-detected materials, wherein to-be-detected battery materials are transported to an OCV detection location to perform detection, and when the detection result is unqualified, all the materials are transported to a replacement location; — S001

Perform OCV detection on transferred materials, wherein the OCV detection is performed on transferred battery materials at a transfer station, and the quantity of the detected transferred battery materials is one or more; — S002

Perform primary battery replacement, wherein after the OCV detection, defective products in the to-be-detected battery materials are transferred to the transfer station, and good products from the transferred battery materials are transferred to the replacement location for replacement. — S003 more batteries per unit time and achieve a high detection efficiency.

11 Claims, 6 Drawing Sheets

(58) Field of Classification Search
USPC ...................................... 324/500, 600, 76.11
See application file for complete search history.

(56) References Cited

U.S. PATENT DOCUMENTS

| | | | | | |
|---|---|---|---|---|---|
| 2012/0248868 | A1 * | 10/2012 | Mobin | .................... | B60L 50/30 |
| | | | | | 414/589 |
| 2012/0274331 | A1 * | 11/2012 | Liu | .................... | G01R 31/3835 |
| | | | | | 324/426 |
| 2016/0306013 | A1 * | 10/2016 | Kondo | ............... | G01R 31/3835 |
| 2017/0146610 | A1 * | 5/2017 | Cha | ........................ | H01M 10/48 |
| 2020/0298724 | A1 * | 9/2020 | Rhodes | ............... | G05D 1/0088 |
| 2024/0009449 | A1 * | 1/2024 | Daglow | .................... | A61B 5/24 |
| 2024/0274857 | A1 * | 8/2024 | Park | .................... | H01M 10/625 |

FOREIGN PATENT DOCUMENTS

| | | | |
|---|---|---|---|
| CN | 110773461 | A | 2/2020 |
| CN | 111665448 | A | 9/2020 |
| CN | 112010009 | A | 12/2020 |
| CN | 114586230 | A | 6/2022 |
| CN | 114887934 | A | 8/2022 |
| CN | 217239530 | U | 8/2022 |
| CN | 115133098 | A | 9/2022 |
| CN | 115336081 | A | 11/2022 |
| CN | 217901984 | U | 11/2022 |
| CN | 115502099 | A | 12/2022 |
| CN | 217990055 | U | 12/2022 |
| CN | 218531856 | U | 2/2023 |

OTHER PUBLICATIONS

The World Intellectual Property Organization (WIPO) International Search Report for PCT/CN2023/101923 Dec. 20, 2023 8 pages (including English translation).
State Intellectual Property Office of China The First Office Action for Application No. 202380067509.5, Oct. 24, 2025, 16 pages (including translation).

* cited by examiner

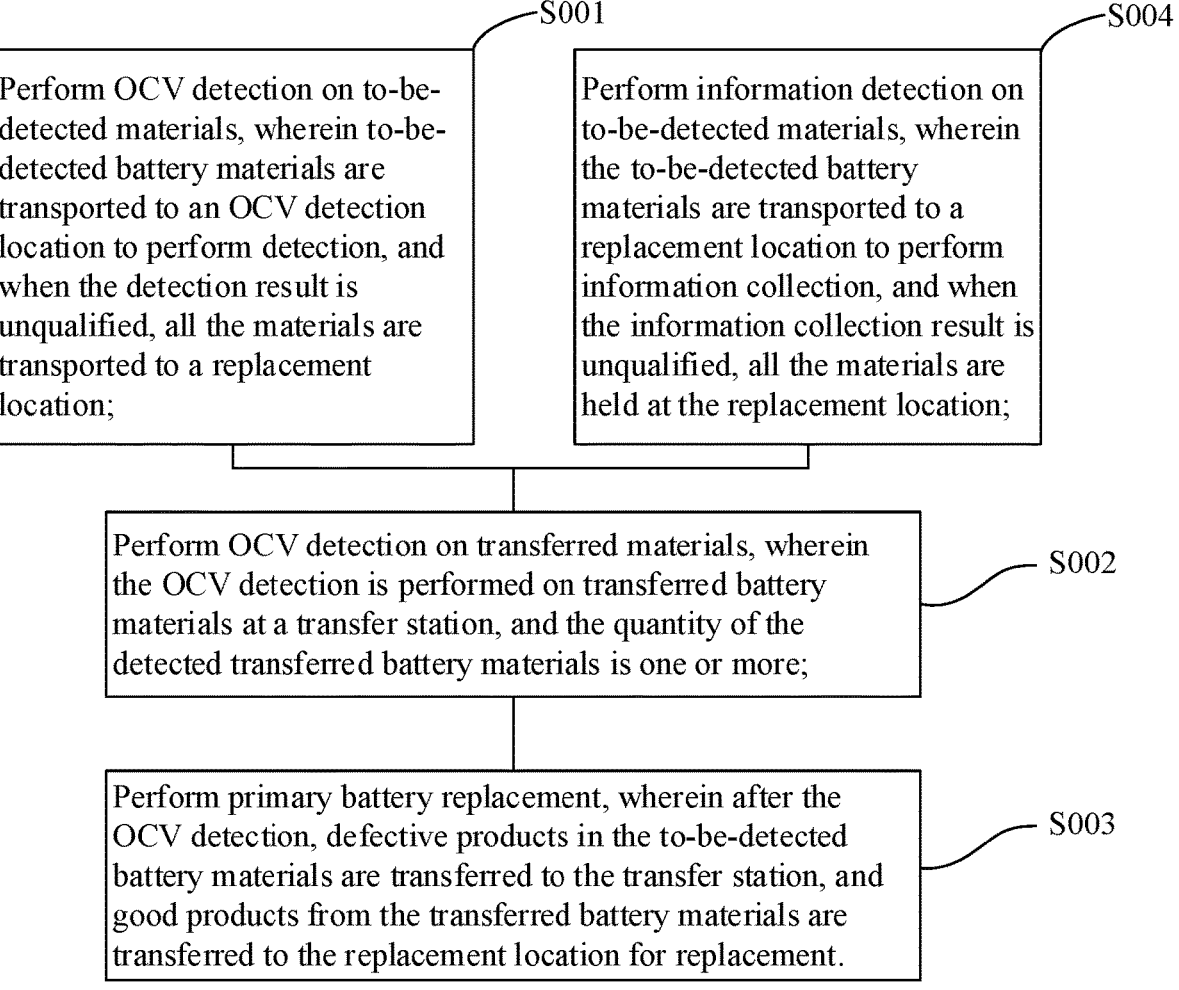

S001

Perform OCV detection on to-be-detected materials, wherein to-be-detected battery materials are transported to an OCV detection location to perform detection, and when the detection result is unqualified, all the materials are transported to a replacement location;

S004

Perform information detection on to-be-detected materials, wherein the to-be-detected battery materials are transported to a replacement location to perform information collection, and when the information collection result is unqualified, all the materials are held at the replacement location;

Perform OCV detection on transferred materials, wherein the OCV detection is performed on transferred battery materials at a transfer station, and the quantity of the detected transferred battery materials is one or more;

S002

Perform primary battery replacement, wherein after the OCV detection, defective products in the to-be-detected battery materials are transferred to the transfer station, and good products from the transferred battery materials are transferred to the replacement location for replacement.

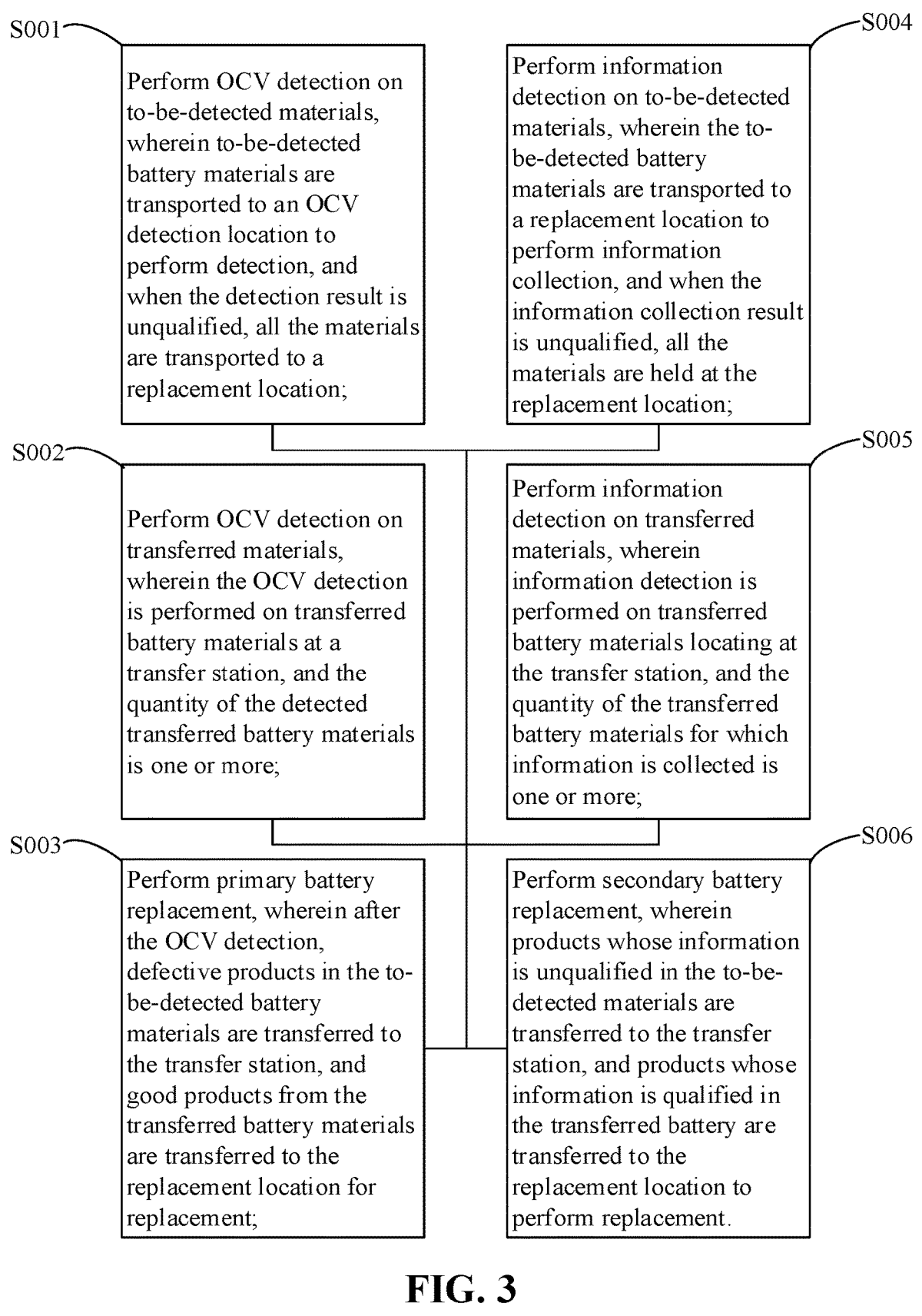

Perform OCV detection on to-be-detected materials, wherein to-be-detected battery materials are transported to an OCV detection location to perform detection, and when the detection result is unqualified, all the materials are transported to a replacement location;

S004

Perform information detection on to-be-detected materials, wherein the to-be-detected battery materials are transported to a replacement location to perform information collection, and when the information collection result is unqualified, all the materials are held at the replacement location;

S002

Perform OCV detection on transferred materials, wherein the OCV detection is performed on transferred battery materials at a transfer station, and the quantity of the detected transferred battery materials is one or more;

S005

Perform information detection on transferred materials, wherein information detection is performed on transferred battery materials locating at the transfer station, and the quantity of the transferred battery materials for which information is collected is one or more;

S003

Perform primary battery replacement, wherein after the OCV detection, defective products in the to-be-detected battery materials are transferred to the transfer station, and good products from the transferred battery materials are transferred to the replacement location for replacement;

S006

Perform secondary battery replacement, wherein products whose information is unqualified in the to-be-detected materials are transferred to the transfer station, and products whose information is qualified in the transferred battery are transferred to the replacement location to perform replacement.

FIG. 3

OCV DETECTION METHOD AND DETECTION DEVICE

CROSS-REFERENCE TO RELATED APPLICATION

This application is a continuation of International Application No. PCT/CN2023/101923, filed on Jun. 21, 2023, the entire content of which is incorporated herein by reference.

TECHNICAL FIELD

The present application relates to the field of OCV detection technologies, and in particular, to an OCV detection method and a detection apparatus for implementing the OCV detection method.

BACKGROUND

After battery cells complete processes of formation, capacity separation, and labeling, the battery cells also need to be tested for OCV (Open Circuit Voltage). The K value (which is the voltage drop of a battery cell per unit time, representing the self-discharge rate of the battery cell), current, voltage, capacity and other parameters of battery cells can be obtained through the OCV test so as to screen out battery cells with unqualified electrochemical parameters, thereby ensuring the quality of each batch of battery cells.

At present, the OCV detection process of batteries is as follows: batches of battery cell materials are transported to an OCV detection location via a transmission line, after a first batch of detected battery cells being stored in a transfer station, a second batch of battery cells is transferred to a OCV detection location to perform detection, once a defective product occurs, a good product from the first batch locating at the transfer station will be supplemented to the second batch so as to ensure that all of battery cells in the second batch are qualified, then, they are transported to the next location, which result in a relatively low detection efficiency of the current OCV detection method.

SUMMARY OF THE INVENTION

An objective of the embodiments of the present application is to provide an OCV detection method and a detection device, aiming to improve the technical problem of low detection efficiency of current OCV detection method.

The technical solutions used in the embodiments of the present application are as follows:

In a first aspect, an embodiment of the present application provides an OCV detection method, including:

performing OCV detection on to-be-detected materials, wherein to-be-detected battery materials are transported to an OCV detection location for detection, and when the detection result is unqualified, all the materials are transported to a replacement location;

performing OCV detection on transferred materials, wherein the OCV detection is performed on transferred battery materials at a transfer station, and the quantity of the detected transferred battery materials is one or more; and performing primary battery replacement, wherein after the OCV detection, defective products in the to-be-detected battery materials are transferred to the transfer station, and good products in the transferred battery materials are transferred to the replacement location for replacement.

The technical solutions described in the embodiments of the present application have at least the following technical effects or advantages:

In the OCV detection method provided in the embodiment of the present application, an OCV detection is performed on to-be-detected battery materials, and at the same time, the OCV detection is also performed on transferred battery materials. Thus, in the battery production process, it is equivalent to setting up two OCV detection locations, and the two OCV detection locations do not interfere with each other. In order to ensure stable output of batches of good products from the to-be-detected materials, it is also possible to replace defective products in the to-be-detected battery materials with good products in the transferred battery materials. In this way, in addition to performing OCV detection on regular to-be-detected battery materials, OCV detection can also be performed on transferred battery materials, in this way, it is possible to detect more batteries per unit time and achieve a higher detection efficiency.

In some embodiments, the OCV detection method further comprises:

performing information detection on the to-be-detected materials, wherein the to-be-detected battery materials are transported to a replacement location for information collection, and when the information collection result is unqualified, all the materials are held at the replacement location.

In the above technical solution, it is also possible to perform corresponding information detection on to-be-detected battery materials, and unqualified batteries after information collection are held at the replacement location and wait to be replaced.

In some embodiments, the OCV detection method further comprises:

performing information detection on transferred materials, that is, information of the transferred battery materials at the transfer station is collected, and the quantity of the transferred battery materials for which information is collected is one or more; and performing secondary battery replacement, wherein products whose information is unqualified in the to-be-detected materials are transferred to the transfer station, and products whose information is qualified in the transferred battery are transferred to the replacement location for replacement.

In the above technical solution, it is also possible to perform corresponding information detection on the transferred battery materials, and qualified transferred battery materials are used to replace defective products in the to-be-detected battery materials.

In some embodiments, in the step of performing OCV detection on the transferred materials, the defective products in transferred battery materials locating at the transfer station are classified and stored.

In the above technical solution, by classifying defective products in the transferred battery materials locating at the transfer station, confusion with undetected batteries can be avoided, in addition, which also facilitates the replacement of defective to-be-detected battery materials.

In some embodiments, in the step of performing information detection on the transferred materials, defective products in the transferred battery materials locating at the transfer station are classified and stored.

In the above technical solution, by classifying defective products in the transferred battery materials locating at the transfer station, confusion with undetected batteries can be avoided, in addition, which also facilitates the replacement of defective to-be-detected battery materials.

In a second aspect, the embodiment of the present application further provides a detection device, configured to implement above-mentioned OCV detection method, the detection device includes:

a transmission line, the transmission line being used to transport to-be-detected battery materials, and the transmission line being provided with an OCV detection location and a replacement location;

a transfer station at which a plurality of transferred battery materials are stored;

a first OCV detection apparatus, the first OCV detection apparatus being used to perform OCV detection on the to-be-detected battery materials;

a second OCV detection apparatus, the second OCV detection apparatus being used to perform OCV detection on the transferred battery materials; and a transit apparatus, the transit apparatus being used to realize material replacement between to-be-detected battery cell materials and the transferred battery materials;

wherein the first OCV detection apparatus is arranged at the OCV detection location, the transit apparatus moves back and forth between the transfer station and the replacement location, and the second OCV detection apparatus is arranged on the transit apparatus, and is capable of moving back and forth between the transfer station and the replacement location.

In the detection device according to the embodiments of the present application, the transmission line is used to transport the to-be-detected battery materials to the OCV detection location and the replacement location, the transfer station is used to store a plurality of transferred battery materials, the first OCV detection apparatus is used to perform OCV detection on each to-be-detected battery material, the second OCV detection apparatus is used to perform detection on the transferred battery materials, and the transit apparatus is used to realize material replacement between to-be-detected battery cell materials and the transferred battery materials. In this way, fast material unloading in the transmission line can be achieve, and a higher efficiency can be realized.

In some embodiments, the first OCV detection apparatus includes a bracket and a plurality of first test probe mechanisms slidably connected to the bracket along a first direction.

In the above technical solution, each first test probe mechanism corresponds to one to-be-detected battery material and performs test thereon, meanwhile, the distance between each first test probe mechanism can be adjusted according to different size specifications of the to-be-detected battery materials.

In some embodiments, the transit apparatus includes a first linear module, a second linear module slidably connected to the first linear module, and a claw mechanism disposed on the second linear module, one end of the first linear module extends to the replacement location and the other end extends to the transfer station, the second linear module moves back and forth relative to the first linear module along a first direction, the claw mechanism moves back and forth relative to the second linear module along a second direction, and the first direction is perpendicular to the second direction.

In the above technical solution, the second linear module drives the claw mechanism to move back and forth between the transfer station and the replacement location, so as to realize replacement between to-be-detected battery cell materials and the transferred battery materials.

The claw mechanism moves back and forth relative to the second linear module in the second direction, so as to grip the to-be-detected battery material and the transferred battery material.

In some embodiments, the second OCV detection apparatus includes a second test probe mechanism, the second test probe mechanism is provided on the second linear module. In the above technical solution, the second test probe mechanism is used to detect the transferred battery material, and the second test probe mechanism is capable of moving back and forth in the second direction.

In some embodiments, the detection device further includes an information collection mechanism, the information collection mechanism is provided on the transit apparatus and is capable of moving back and forth between the transfer station and the replacement location.

In the above technical solution, the information of the to-be-detected battery material and the transferred battery material are detected by using the information collection mechanism.

In some embodiments, the transfer station comprises a storage box and a tray mechanism for supporting the storage box, and a plurality of storage cells are formed inside the storage box.

In the above technical solution, the storage box is used to accommodate each transferred battery material, the tray mechanism is used to support the storage box, and the transferred battery materials are placed in corresponding storage cells.

In some embodiments, the tray mechanism comprises at least two tray bodies arranged in a stacked manner and a sliding rail structure provided between any two adjacent tray bodies, wherein one of the tray bodies may slide relative to the other tray body along the guide direction of the sliding rail structure.

In the above technical solution, one of the tray bodies may slide relative to the other tray body along the guide direction of the sliding rail structure, so that the storage box can be extended in space, thereby facilitating loading and unloading materials into and out of the storage box.

In some embodiments, the sliding rail structure includes a guide rail provided on one of the tray bodies and a slider provided on the other tray body, and the slider is slidably connected to the guide rail.

In the above technical solution, under the sliding action between the slider and the guide rail, two adjacent tray bodies can slide relative to each other.

DESCRIPTION OF DRAWINGS

To describe the technical solutions in the embodiments of the present application more clearly, the following briefly describes the embodiments or accompanying drawings required for related technologies. Apparently, the accompanying drawings in the following description are merely some embodiments of the present application, and a person of ordinary skill in the art may further obtain other drawings based on these accompanying drawings without creative efforts.

FIG. 2 is another flowchart of an OCV detection method according to an embodiment of the present application;

FIG. 3 is still other flowchart of an OCV detection method according to an embodiment of the present application;

Figure 1:
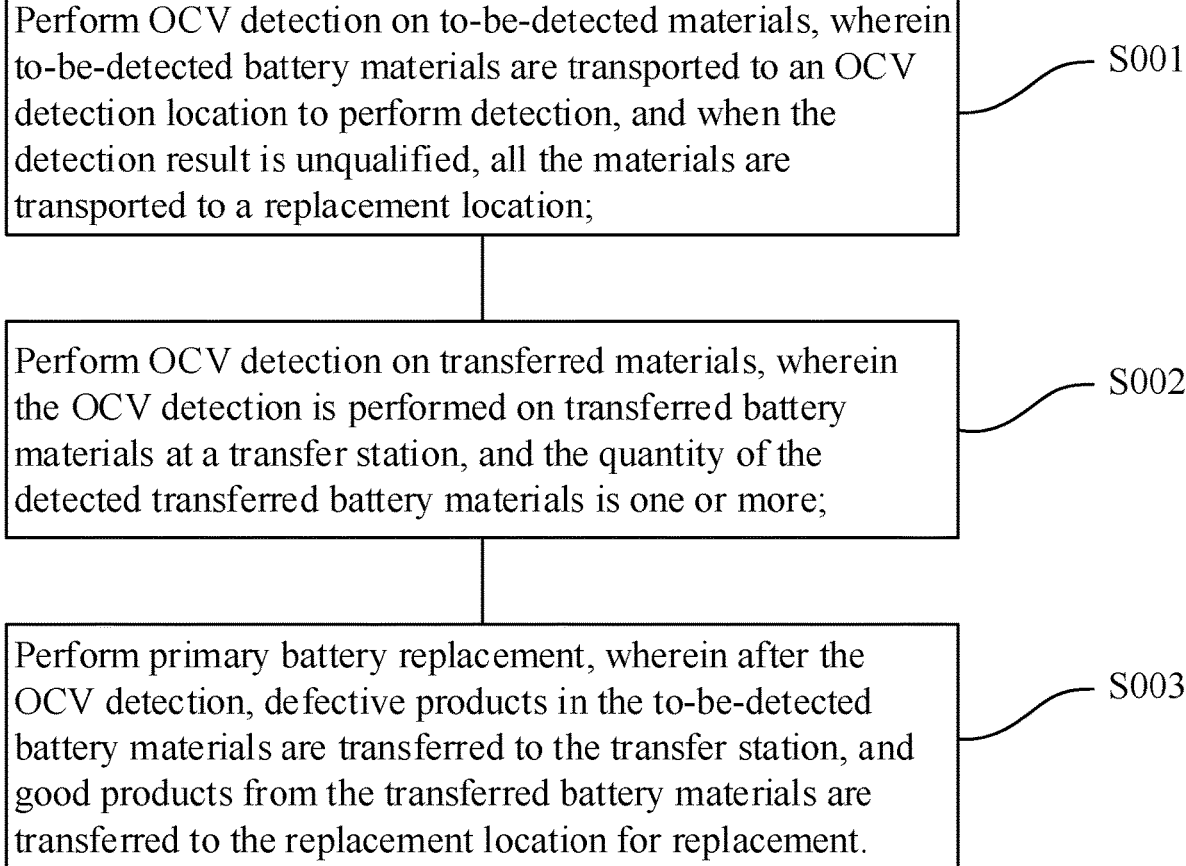
FIG. 1 is a flowchart of an OCV detection method according to an embodiment of the present application.

DESCRIPTION OF REFERENCE NUMERALS 100. detection device;
10. transmission line; 10*a*. OCV detection location; 10*b*. replacement location;
20. transfer station; 21. storage box; 22. tray mechanism; 21*a*. storage cell; 221. tray body; 222. sliding rail structure; 2221. guide rail; 2222. slider;
30. first OCV detection apparatus; 31. bracket; 32. first test probe mechanism;
40. second OCV detection apparatus; 41. second test probe mechanism;
50. transit apparatus; 51. first linear module; 52. second linear module; 53. claw mechanism;
60. information collection mechanism;
first direction X; second direction Y.

DETAILED DESCRIPTION

The embodiments of the present application are described in detail below, examples of the embodiments are shown in the accompanying drawings, in which same or similar reference numerals refer to the same or similar elements or elements having the same or similar functions throughout. The embodiments described below with reference to the accompanying drawings are intended to explain the present application, and should not be construed as a limitation to the present application.

Unless otherwise defined, all technical and scientific terms used herein shall have the same meanings as commonly understood by those skilled in the art to which the present application belongs. The terms used herein are merely intended to describe the specific embodiments but not intended to constitute any limitation on the present application. The terms "include" and "have" and any variations thereof in the specification, claims and above accompanying drawings of the present application are intended to cover non-exclusive inclusion.

In the description of the embodiments of this application, the orientation or positional relationship indicated by the terms "length", "width", "thickness", "inner", "outer", "upper", "lower", "left", "right", and the like is based on the orientation or positional relationship shown in the accompanying drawings. This is merely used for ease of description of the present application and simplify the description, but is not intended to indicate or imply that the apparatus or element referred to must have a particular orientation or be constructed and operated in a particular orientation, and therefore cannot be understood as limiting the present application.

The terms "first", "second", and the like are merely used to distinguish between descriptions, but cannot be understood as indicating or implying relative importance or implicitly indicating the number of indicated technical features. For example, a first guide member and a second guide member are merely intended to distinguish different guide members, and are not limited in a sequence. The first guide member may also be named as the second guide member, and the second guide member may also be named as the first guide member without departing from the scope of various embodiments described. Furthermore, the terms "first", "second", and the like do not necessarily indicate that the features thereof are different.

In the description of the embodiments of the present application, unless otherwise expressly specified and limited, the terms "join", "connect" etc. should be understood in a broad sense, such as, a fixed connection, a detachable connection, or an integral connection; a mechanical connection, or an electrical connection; a direct connection, or an indirect connection through an intermediate medium, an internal connection of two elements, or interaction between two elements. For a person of ordinary skill in the art, specific meanings of the foregoing terms in the present application may be understood based on a specific case. The meaning of "a plurality of" is at least two, that is, two or more.

In the present application, the term "and/or" is only an association relationship for describing associated objects, indicating that three relationships may exist. For example, A and/or B may represent three situations: A exists alone, both A and B exist, and B exists alone. In addition, the character "/" herein generally means that the associated objects before and after are in an "or" relationship.

It should be noted that, in the present application, words such as "in some embodiments", "exemplarily", and "for example" are used to indicate examples, illustrations or explanations. Any embodiment or design scheme described in the present application as "in some embodiments", "exemplarily" and "for example" should not be construed as more preferred or advantageous than other embodiments or designs. Specifically, use of words such as "in some embodiments", "exemplarily", "for example" and the like is intended to present related concepts in a particular manner, meaning that particular features, structures, or characteristics described in connection with the embodiments may be included in at least one embodiment of the present application. The foregoing terms do not necessarily refer to the same embodiment, nor are they independent or alternative embodiments mutually exclusive to other embodiments. It is explicitly and implicitly understood by a person skilled in the art that the embodiments described herein may be combined with other embodiments.

In order to make the purpose, technical solutions and advantages of the application clearer, the present application will be described in further detail below in connection with the drawings and embodiments.

After battery cells complete processes of formation, capacity separation, and labeling, the battery cells also need to be tested for OCV (Open Circuit Voltage). The K value (which is the voltage drop of a battery cell per unit time, representing the self-discharge rate of the battery cell), current, voltage, capacity and other parameters of battery cells can be obtained through the OCV test so as to screen out battery cells with unqualified electrochemical parameters, thereby ensuring the quality of each batch of battery cells.

Generally, the battery OCV detection process in the production line is to transport batches of battery cell materials to a OCV detection location via a transmission line, the battery cells detected in the first batch are stored in a transfer station, quantity and positions of good products therein are recorded, when the next batch of battery cells is transported to the OCV detection location to perform detection, once a defective product occurs, a good product from the first batch locating at the transfer station will be supplemented to the second batch so as to ensure that all of battery cells in the second batch are qualified, then, they are transported to the next location. In this way, once a defective product occurs in one batch of battery cells, this batch of battery cells needs to be supplemented by a good battery cell in the previous batch, so that the overall test amount of the battery cells does not change. The detection efficiency of this OCV detection method is relatively low.

In view of this, the present application provides an OCV detection method, an OCV detection for transferred materials is added therein, that is, the OCV detection is performed on transferred battery materials at a transfer station. In this way, it does not interfere with the OCV detection performed on to-be-detected battery materials in the production line. In addition, in order to ensure a stable output of batches of good products from the to-be-detected materials, it is also possible to replace defective products in the to-be-detected battery materials with good products from the transferred battery materials. The total amount of batteries subjected to OCV detection per unit time has increased, that is, the detection efficiency is higher.

Please refer to FIG. 1, FIG. 1 is a flowchart of an OCV detection method according to an embodiment of the present application.

The OCV detection method includes:

S001. Perform OCV detection on to-be-detected materials, wherein the to-be-detected battery materials are transported to an OCV detection location to perform detection, when the detection result is unqualified, all the materials are transported to a replacement location;

the to-be-detected battery materials may be a relatively large number of batteries in a total amount of batteries, they are transported to an OCV detection location and a replacement location via a transmission line. The OCV detection is performed at the detraction location, and then the qualified batteries are flowed to next location. Unqualified batteries are transported to a replacement location and wait to be replaced.

S002. Perform OCV detection on transferred materials, wherein the OCV detection is performed on transferred battery materials at a transfer station, and the quantity of the detected transferred battery materials is one or more;

the transferred battery materials are materials come from different batch or different transmission line compared with the to-be-detected battery material. For example, the transferred battery materials may be batteries that are transported to the transfer station via another transmission line, or may be batteries that are directly stored at the transfer station, which are used to replace and supplement defective products in to-be-detected battery materials. In this step, one or more transferred battery material can be detected in one OCV detection.

The transfer station may be a location or device for storing or transferring batteries.

S003. Perform primary battery replacement, wherein after the OCV detection, defective products in the to-be-detected battery materials are transferred to the transfer station, and good products from the transferred battery materials are transferred to the replacement location for replacement.

In this step, batteries locating at the transfer station and the replacement location are swapped to supplement defective products in the to-be-detected battery materials after the OCV detection.

Here, it should be noted that there is no sequential relationship between step S001 and step S002, and in some embodiments, step S001 and step S002 may be performed simultaneously.

In the OCV detection method provided in the embodiment of the present application, an OCV detection is performed on to-be-detected battery materials, and at the same time, the OCV detection is also performed on transferred battery materials. Thus, in the battery production process, it is equivalent to setting up two OCV detection locations, and the two OCV detection locations do not interfere with each other. In order to ensure stable output of batches of good products from the to-be-detected materials, it is also possible to replace defective products in the to-be-detected battery materials with good products in the transferred battery materials. In this way, in addition to performing OCV detection on regular to-be-detected battery materials, the OCV detection can also be performed on transferred battery materials, so that it is possible to detect more batteries per unit time and achieve a higher detection efficiency.

Referring to FIG. 2, in some embodiments, the OCV detection method includes:

S004. Perform information detection on the to-be-detected materials, wherein the to-be-detected battery materials are transported to a replacement location to perform information collection, and when the information collection result is unqualified, all the materials are held at the replacement location.

Here, the information detection may include batch information, production date information, type information, etc. of to-be-detected battery material. A battery will be deemed as a defective product if the information collection result thereof is not qualified, then the to-be-detected battery materials in the current batch are held at the replacement location waiting for supplementary replacement.

Here, it should be noted that there is no sequential relationship between step S004 and step S001, and in some embodiments, step S001 and step S004 may be performed simultaneously.

For example, in one embodiment, the OCV detection and information detection may be performed simultaneously on a current batch of to-be-detected battery materials, where batteries fail in any one of the detections are deemed as defective products, then they are waiting to be replaced by good batteries at the transfer station.

Referring to FIG. 3, in some embodiments, the OCV detection method includes:

S005. Perform information detection on transferred materials, i.e., perform information detection on transferred battery materials locating at the transfer station, and the quantity of the transferred battery materials for which information is collected is one or more;

likewise, the information detection may include batch information, production date information, type information, etc. of transferred battery materials. A battery will be deemed as a defective product if the information collection result thereof is not qualified. When information collection is performed on transferred battery materials, the quantity of the battery to be collected may be one or more, which is determined according to actual supplementary requirements.

S006. perform secondary battery replacement, wherein products whose information is unqualified in the to-be-detected materials are transferred to the transfer station, and products whose information is qualified in the transferred battery are transferred to the replacement location for replacement.

In this step, batteries at the transfer station and the replacement location are swapped to supplement defective products in the to-be-detected battery materials after the information detection.

Here, it should be noted that there is no sequential relationship between step S002 and step S005, and in some embodiments, step S002 and step S005 may be performed simultaneously.

For example, in an embodiment, the OCV detection and information detection may be performed simultaneously on a current batch of transferred battery materials, where batteries failed in any one of the detections are deemed as defective products, and good products are used for supplementary replacement.

Similarly, there is no sequential relationship between step S003 and step S006, and in some embodiments, step S003 and step S006 may be performed simultaneously.

For example, in an embodiment, one or more of to-be-detected battery materials are deemed as defective products that fail both of the OCV detection and the information detection, and one or more of transferred battery materials are deemed as good products that simultaneously pass the OCV detection and the information detection, in this case, only one battery replacement is required, which is equivalent to perform steps S003 and S006 simultaneously.

In an embodiment, in the step of performing OCV detection on the transferred materials, defective products in transferred battery materials locating at the transfer station are classified and stored.

It may be understood that the transferred battery materials locating at the transfer station may be classified into the following types: the first one is qualified products that have completed the OCV detection; and the second one is unqualified products that have completed the OCV detection.

In order to avoid confusion of unloading transferred battery materials at the transfer station, the defective products need to be classified, and after the classification, the other part are all good products. For example, an area for defective products and an area for good products may be formed through division at the transfer station, after OCV detection, defective products are all placed in the defective product area, and good products are placed in the good product area.

In an embodiment, in the step of performing information detection on the transferred materials, defective products in the transferred battery materials locating at the transfer station are classified and stored.

It may be understood that the transferred battery materials at the transfer station may be classified into the following types: the first one is qualified products that have completed the information detection; and the second one is unqualified products that have completed the information detection.

In order to avoid confusion of unloading transferred battery materials at the transfer station, the defective products need to be classified, and after the classification, the other part are all good products. For example, an area for defective products and an area for good products may be formed through division at the transfer station, after information detection, defective products are all placed in the defective product area, and good products are placed in the good product area.

In another embodiment, batteries fail in any one of the OCV detection and the information detection are deemed as defective products, and batteries pass both of the detections are deemed as good products. Therefore, in this embodiment, when dividing the defective product area and the good product area at the transfer station, defective products fail in both of the detections and defective products fail in any one of the detections are all placed in the defective product area, and good products that pass both of the detections are placed in the good product area.

Figure 4:
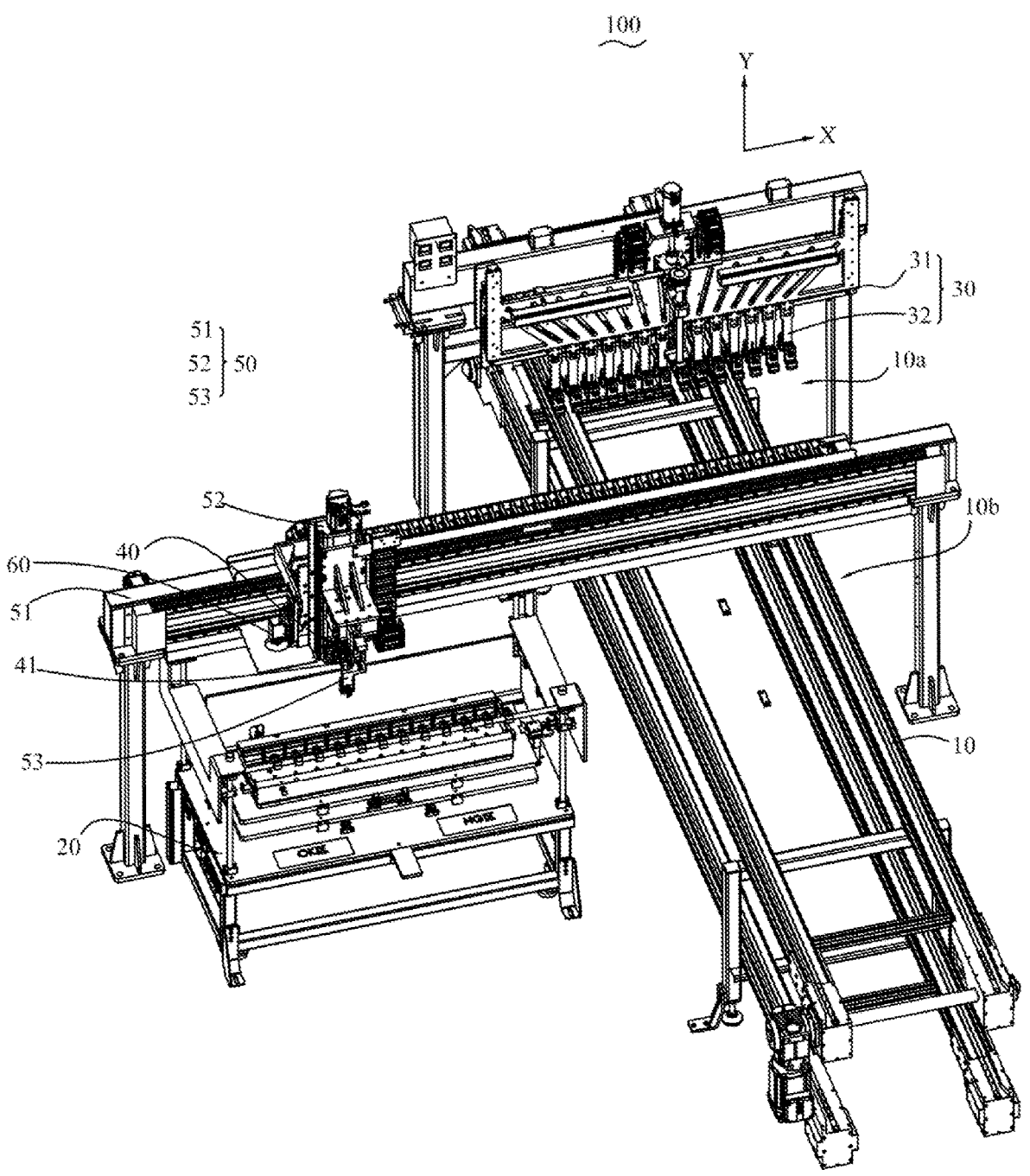
FIG. 4 is a schematic structural diagram of a detection device according to some embodiments of the present application.

Referring to FIG. 4, an embodiment of the present application further provides a detection device 100, configured to implement the above-mentioned OCV detection method. The detection device 100 includes a transmission line 10, a transfer station 20, a first OCV detection apparatus 30, a second OCV detection apparatus 40, and a transit apparatus 50, wherein the transmission line 10 is used to transport to-be-detected battery materials, and the transmission line 10 has an OCV detection location 10A and a replacement location 10b; the transfer station 20 stores a plurality of transferred battery materials; the first OCV detection apparatus 30 is used to perform OCV detection on the to-be-detected battery materials; the second OCV detection apparatus 40 is used to perform OCV detection on the transferred battery materials; the transit apparatus 50 is used to perform replacement between the to-be-detected battery cell materials and the transferred battery materials; the first OCV detection apparatus 30 is disposed at the OCV detection location 10a, the transit apparatus 50 moves back and forth between the transfer station 20 and the replacement location 10b, and the second OCV detection apparatus 40 is disposed on the transfer device 50 and is capable of moving back and forth between the transfer station 20 and the replacement location 10b.

In the detection device 100 provided in the embodiment of the present application, the transmission line 10 is used to transport the to-be-detected battery materials to the OCV detection location 10A and the replacement location, the transfer station 20 is used to store a plurality of transferred battery materials, the first OCV detection apparatus 30 is used to perform OCV detection on each to-be-detected battery material, the second OCV detection apparatus 40 is used to perform detection on the transferred battery material, and the transit apparatus 50 is used to realize replacement between the to-be-detected battery cell materials and the transferred battery materials. In this way, fast material unloading on the transmission line 10 can be achieved, and higher efficiency can be realized.

Referring to FIG. 4, in some embodiments, the first OCV detection apparatus 30 includes a bracket 31 and a plurality of first test probe mechanisms 32 slidably connected to the bracket 31 along a first direction X.

It may be understood that the bracket 31 plays a role of fixing and supporting. The sliding connection between each first test probe mechanism 32 and a fixed mechanism may be a direct sliding connection or an indirect sliding connection.

For example, the bracket 31 is provided with a sliding groove extending along the first direction X, each of the first test probe mechanisms 32 is provided with a protrusion that matches the sliding groove, and the relative sliding between the first test probe mechanism 32 and the bracket 31 is realized by sliding of the protrusion in the sliding groove, and the direction and distance of sliding are not limited.

For example, bracket 31 is provided with a sliding rail, a slider slidably connected to the sliding rail is provided on each of the first test probe mechanisms 32, and relative sliding between each of the first test probe mechanisms 32 and the bracket 31 is realized by sliding engagement between the slider and the sliding rail, and the direction and distance of sliding are not limited.

Here, the first direction X is an arrangement direction of the battery materials, and may be any one of the width direction, the length direction, or the thickness direction of the batteries.

In this way, each first test probe mechanism 32 corresponds to one to-be-detected battery material and performs test thereon, meanwhile, the distance between each first test probe mechanism 32 can be adjusted according to different size specifications of the to-be-detected battery materials.

Referring to FIG. 4, in some embodiments, the transit apparatus 50 includes a first linear module 51, a second linear module 52 slidably connected to the first linear module 51, and a claw mechanism 53 disposed on the second linear module 52. One end of the first linear module 51 extends to the replacement location 10*b* and the other end extends to the transfer station 20. The second linear module 52 moves back and forth relative to the first linear module 51 along the first direction X, the claw mechanism 53 moves back and forth relative to the second linear module 52 along the second direction Y, wherein the first direction X is perpendicular to the second direction Y.

It may be understood that the first linear module 51 is used to realize reciprocating movement of the second linear module 52 in the first direction X, and the first linear module 51 may be a combination of a chain and a sliding mechanism. The second linear module 52 is used to realize the reciprocating movement of the claw mechanism 53 in the second direction Y. The second linear module 52 includes, but is not limited to, a lifting mechanism, a telescopic cylinder, a lead screw mechanism, a servo motor, and the like.

Here, the second direction Y may be the gravity direction.

In this way, the second linear module 52 drives the claw mechanism 53 to move back and forth between the transfer station 20 and the replacement location 10*b*, so as to realize replacement between the to-be-detected battery material and transferred battery material. The claw mechanism 53 moves back and forth relative to the second linear module 52 in the second direction Y, so as to grip the to-be-detected battery material or the transferred battery material.

Referring to FIG. 4, in some embodiments, the second OCV detection apparatus 40 includes a second test probe mechanism 41, and the second test probe mechanism 41 is disposed on the second linear module 52.

Here, the second test probe mechanism 41 may be in the same or different structure as the first test probe mechanism 32, in addition, the second test probe mechanism 41 is capable of moving back and forth along the second direction Y to perform detection on the transferred battery material at the transfer station 20.

In this way, the second test probe mechanism 41 is configured to detect the transferred battery material, and the second test probe mechanism 41 is capable of moving back and forth along the second direction Y.

Referring to FIG. 4, in some embodiments, the detection device 100 further includes an information collection mechanism 60. The information collection mechanism 60 is disposed on the transit apparatus 50, and is capable of moving back and forth between the transfer station 20 and the replacement location 10*b*.

It may be understood that the information collection mechanism 60 includes, but is not limited to, a video camera, a scanner, a photo camera, and the like, and the information collection mechanism 60 is used to collect image or text information. Meanwhile, the information acquisition mechanism 60 arranged on the transit apparatus 50 may collect information of to-be-detected battery materials and information of transferred battery materials.

In some embodiments, the information collection mechanism 60 is arranged on the second linear module 52 of the transit apparatus 50, so as to realize reciprocating movement between the transfer station 20 and the replacement location 10*b*.

Figure 5:
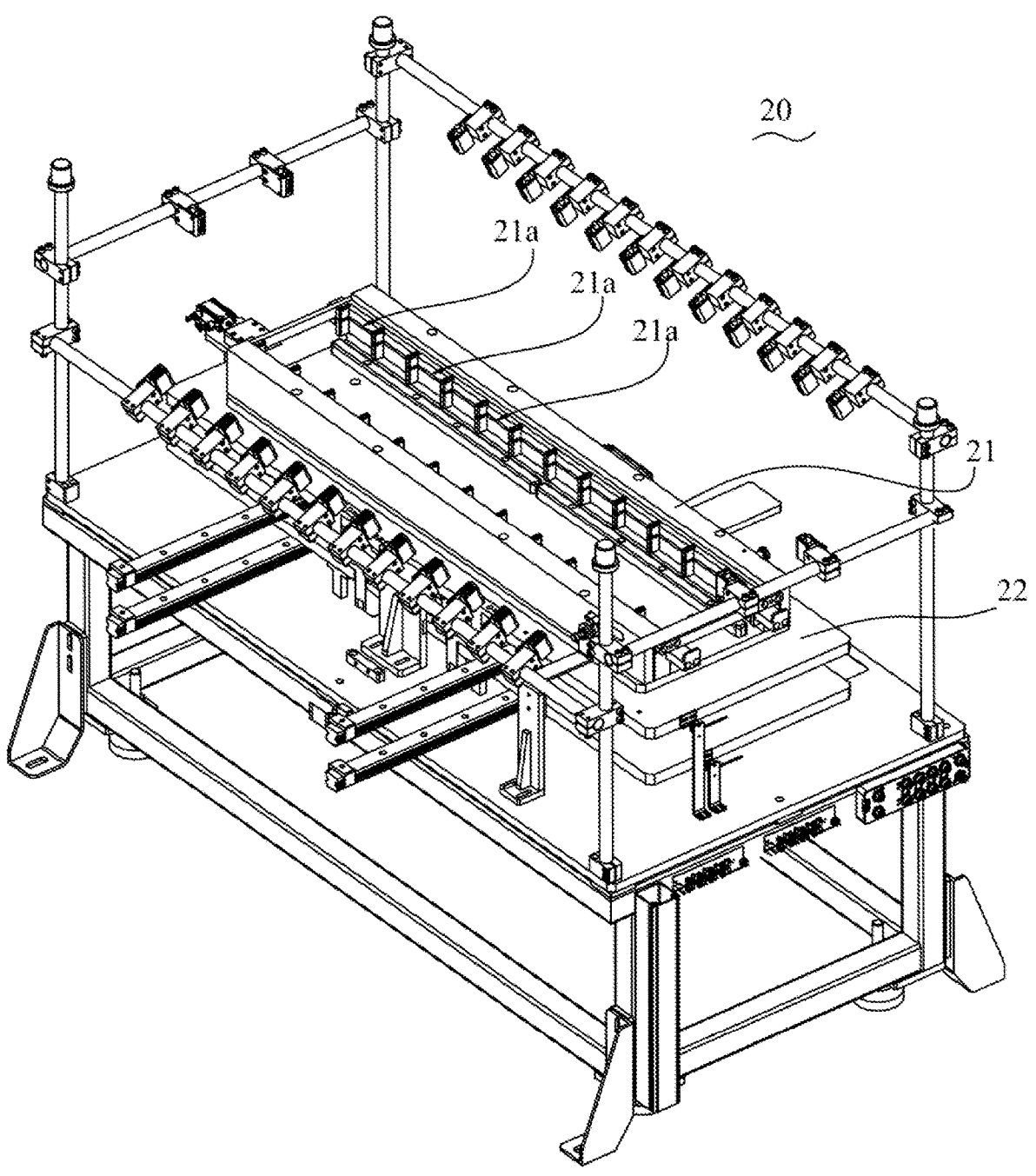
FIG. 5 is a schematic structural diagram of a transfer station of a detection device according to some embodiments of the present application.
Figure 6:
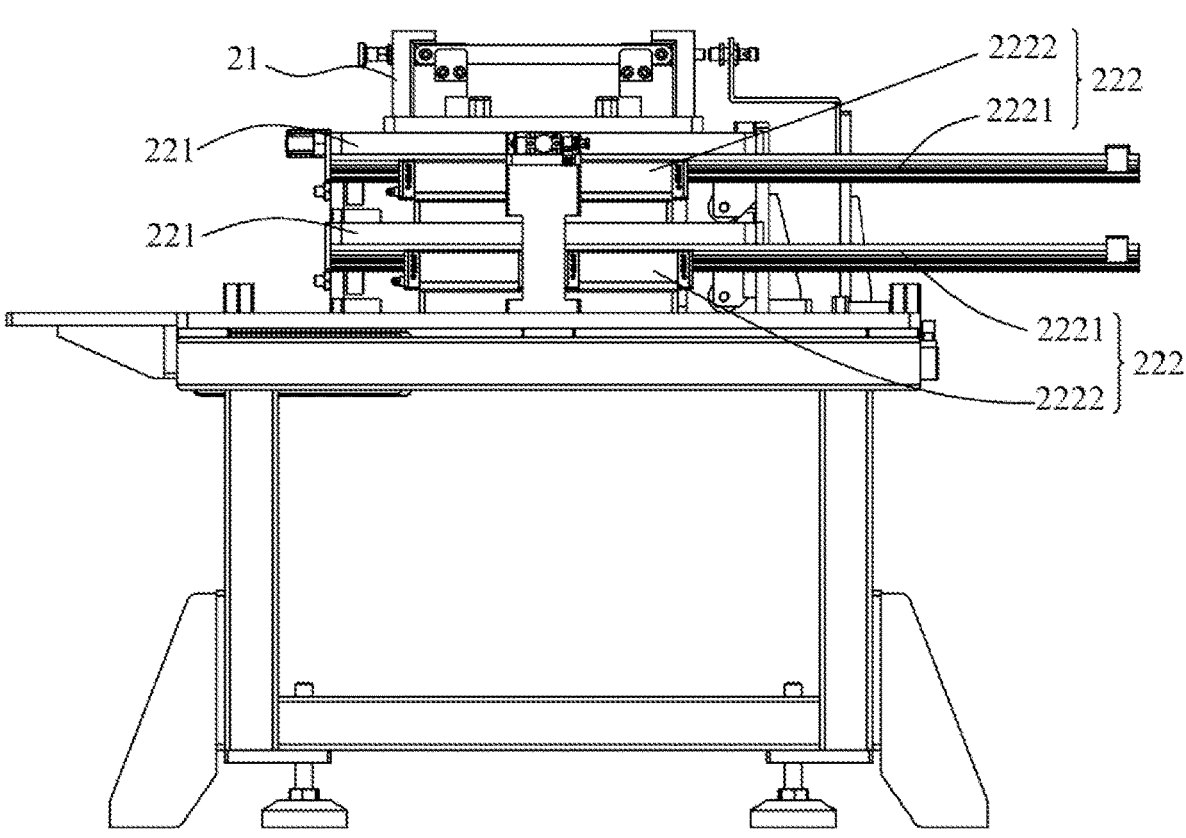
FIG. 6 is a left view of a transfer station of a detection device according to some embodiments of the present application.

Referring to FIG. 5 and FIG. 6, in some embodiments, the transfer station 20 includes a storage box 21 and a tray mechanism 22 for supporting the storage box 21, and a plurality of storage cells 21*a* are formed in the storage box 21.

It may be understood that the storage box 21 is used to place each transferred battery material, the tray mechanism 22 is used to support the storage box 21, and the transferred battery materials are placed in corresponding storage cells 21*a*.

In some embodiments, the storage cells 21*a* may be divided into two areas, storage cells 21*a* in one area are used to store defective products, and storage cells 21*a* in the other area are used to store good products.

Referring to FIG. 5 and FIG. 6, in some embodiments, the tray mechanism 22 includes at least two tray bodies 221 arranged in a stacked manner and a sliding rail structure 222 provided between any two adjacent tray bodies 221, and one of the tray bodies 221 may slide relative to the other tray body 221 along a guide direction of the sliding rail structure 222.

It may be understood that one of the tray bodies 221 may slide relative to the other tray body 221 in the guide direction of the sliding rail structure 222, so that the storage box 21 can be extended in space, thereby facilitating loading and unloading materials into and out of the storage box 21.

Referring to FIG. 6, in some embodiments, the sliding rail structure 222 includes a guide rail 2221 disposed on one of the tray bodies 221 and a slider 2222 disposed on the other tray body 221, and the slider 2222 is slidably connected to the guide rail 2221.

In this way, under the sliding action between the slider 2222 and the guide rail 2221, two adjacent tray bodies 221 can slide relative to each other.

The foregoing descriptions are merely implementations of the present application, and are not intended to limit the present application. Any modification, equivalent replacement, or improvement made within the spirit and principle of the present application shall fall within the protection scope of the present application.

What is claimed is:

1. An open circuit voltage (OCV) detection method, comprising:

performing OCV detection, via a transmission line, on one or more to-be-detected battery materials at a first location to obtain a detection result, and in response to the detection result not satisfying a first condition, transporting the one or more to-be-detected battery materials to a second location;

performing OCV detection, via the transmission line, on one or more transferred battery materials at a third location;

performing primary battery replacement, including transferring one of the one or more to-be-detected battery materials that does not meet a criteria to the third location, and transferring one of the one or more transferred battery materials that meets the criteria to the second location for replacement;

collecting, via a collection mechanism, information of the one or more to-be-detected battery materials at the second location, wherein the information of the one or more to-be-detected battery materials comprises batch information or production date information of the one or more to-be-detected battery materials;

collecting, via the collection mechanism, information of the one or more transferred battery materials at the third location, wherein the information of the one or more transferred battery materials comprises batch information or production date information of the one or more transferred battery materials; and performing secondary battery replacement, including transferring one of the one or more to-be-detected battery materials whose information does not satisfy a second condition to the third location, and transferring one of the one or more transferred battery materials whose information satisfies the second condition to the second location for replacement.

2. The OCV detection method according to claim 1, further comprising:

classifying and storing one of the one or more transferred battery materials that does not meet the criteria at the third location.

3. A detection device, configured to implement the OCV detection method according claim 1, wherein the detection device comprises:

the transmission line, the transmission line being used to transport the one or more to-be-detected battery materials, and the transmission line being provided with the first location and the second location;

a first OCV detection apparatus, the first OCV detection apparatus being used to perform OCV detection on the one or more to-be-detected battery materials;

a second OCV detection apparatus, the second OCV detection apparatus being used to perform OCV detection on the one or more transferred battery materials; and a transit apparatus;

wherein the first OCV detection apparatus is arranged at the first location, the transit apparatus moves back and forth between the third location and the second location, and the second OCV detection apparatus is arranged on the transit apparatus, and is capable of moving back and forth between the third location and the second location.

4. The detection device according to claim 3, wherein the first OCV detection apparatus includes a bracket and a plurality of first test probe mechanisms slidably connected to the bracket along a first direction.

5. The detection device according to claim 3, wherein the transit apparatus includes a first linear module, a second linear module slidably connected to the first linear module, and a claw mechanism disposed on the second linear module, one end of the first linear module extends to the second location and the other end extends to the third location, the second linear module moves back and forth relative to the first linear module along a first direction, the claw mechanism moves back and forth relative to the second linear module along a second direction, and the first direction is perpendicular to the second direction.

6. The detection device according to claim 5, wherein the second OCV detection apparatus comprises a second test probe mechanism, and the second test probe mechanism is disposed on the second linear module.

7. The detection device according to claim 3, wherein the detection device further comprises an information collection mechanism, and the information collection mechanism is disposed on the transit apparatus and is capable of moving back and forth between the third location and the second location.

8. The detection device according to claim 3, wherein a storage box and a tray mechanism for supporting the storage box are provided at the third location, and a plurality of storage cells are formed inside the storage box.

9. The detection device according to claim 8, wherein the tray mechanism comprises at least two tray bodies arranged in a stacked manner and a sliding rail structure provided between any two adjacent tray bodies, wherein one of the tray bodies may slide relative to the other tray body along a guide direction of the sliding rail structure.

10. The detection device according to claim 9, wherein the sliding rail structure comprises a guide rail provided on one of the tray bodies and a slider provided on the other tray body, and the slider is slidably connected to the guide rail.

11. An open circuit voltage (OCV) detection method, comprising:

performing OCV detection, via a transmission line, on one or more to-be-detected battery materials at a first location to obtain a detection result, and in response to the detection result not satisfying a first condition, transporting the one or more to-be-detected battery materials to a second location, and the detection result comprises a voltage drop per unit time of each of the one or more to-be-detected battery materials;

performing OCV detection, via the transmission line, on one or more transferred battery materials at a third location to obtain a voltage drop per unit time of the one or more transferred battery materials;

performing primary battery replacement, including transferring one of the one or more to-be-detected battery materials whose voltage drop per unit time does not meet a criteria to the third location, and transferring one of the one or more transferred battery materials whose voltage drop per unit time meets the criteria to the second location for replacement;

collecting, via a collection mechanism, information of the one or more to-be-detected battery materials at the second location;

collecting, via the collection mechanism, information of the one or more transferred battery materials at the third location; and performing secondary battery replacement, including transferring one of the one or more to-be-detected battery materials whose information does not satisfy a second condition to the third location, and transferring one of the one or more transferred battery materials whose information satisfies the second condition to the second location for replacement.

* * * * *